United States Patent [19]

Lopata et al.

[11] Patent Number: 5,487,920
[45] Date of Patent: Jan. 30, 1996

[54] PROCESS FOR PLASMA-ENHANCED CHEMICAL VAPOR DEPOSITION OF ANTI-FOG AND ANTI-SCRATCH COATINGS ONTO VARIOUS SUBSTRATES

[75] Inventors: Eugene S. Lopata; John S. Nakanishi, both of Alameda County, Calif.

[73] Assignee: The BOC Group, Inc., New Providence, N.J.

[21] Appl. No.: 230,028

[22] Filed: Apr. 19, 1994

[51] Int. Cl.⁶ ............................................. B05D 3/06
[52] U.S. Cl. ...................... 427/489; 427/491; 427/534; 427/536; 427/539
[58] Field of Search ............................. 427/489, 491, 427/534, 535, 536, 539

[56] References Cited

U.S. PATENT DOCUMENTS

| | | | |
|---|---|---|---|
| 4,029,842 | 6/1977 | Yoshida et al. | |
| 4,080,476 | 3/1978 | Laskey | |
| 4,137,365 | 1/1979 | Wydeven et al. | 427/491 |
| 4,467,073 | 8/1984 | Creasy | |
| 4,737,415 | 4/1988 | Ichijo et al. | 427/489 |
| 4,762,730 | 8/1988 | Enke et al. | 427/489 |
| 4,830,873 | 5/1989 | Benz et al. | 427/489 |
| 4,847,160 | 7/1989 | Munz et al. | |
| 4,927,704 | 5/1990 | Reed et al. | |
| 5,051,308 | 9/1991 | Reed et al. | 427/489 |
| 5,075,133 | 12/1991 | Hosono et al. | |
| 5,093,153 | 3/1992 | Brochot et al. | 427/489 |
| 5,211,995 | 5/1993 | Kuehnle et al. | |
| 5,320,875 | 6/1994 | Hu et al. | 427/489 |
| 5,326,584 | 7/1994 | Kamel et al. | 427/491 |

FOREIGN PATENT DOCUMENTS 60-155675  8/1985  Japan.

*Primary Examiner*—Marianne Padgett
*Attorney, Agent, or Firm*—David A. Draegert; Larry R. Cassett

[57] ABSTRACT

A process for the plasma enhanced vapor deposition of a silicon-containing compound having one to three Si atoms onto a surface of glass, mirror, microchip or polymer substrates in flat or complex shape to provide thereon anti-fog and/or anti-scratch coating(s) is provided. The surface modifying step is conducted with a plasma composition derived from a gas stream consisting essentially of from about 80 to 40 mole percent $N_2O$ and from about 20 to 60 mole percent $CO_2$.

13 Claims, No Drawings

PROCESS FOR PLASMA-ENHANCED CHEMICAL VAPOR DEPOSITION OF ANTI-FOG AND ANTI-SCRATCH COATINGS ONTO VARIOUS SUBSTRATES

This invention relates to a process for plasma-induced chemical vapor deposition of anti-fog and anti-scratch films or coatings onto various substrates. More particularly, it relates to a plasma-induced chemical vapor deposition of thin, optically clear films or coatings from an organic compound containing at least one silicon atom onto at least one surface of a variety of flat and three-dimensional and complex substrates.

BACKGROUND OF THE INVENTION

Various types of anti-fog coatings are available in the marketplace, but they lack abrasion resistance or mechanical durability. Typically these anti-fog coatings are both readily abraded or easily dissolved in the cleaning solvents and substances used to clean such coated materials, such as isopropyl alcohol, bleach solutions, and other solvents. Commercially available, anti-scratch coatings, on the other hand, do not have any anti-fog properties. Hence, there is a demand for a more durable, permanent anti-fog coating and for such an anti-fog coating having anti-scratch properties and vice-versa in the marketplace.

Typically anti-fog coatings are formed using wet chemical application methods, such as, described in U.S. Pat. Nos. 4,029,842, 4,080,476, 4,467,073, 4,847,160, 5,075,133 and EP 460,382.

The production of anti,scratch or abrasion resistant coatings by processes employing plasma techniques and silicon containing compounds to provide inorganic coatings containing $SiO_{1.5-2.0}$ and/or silicon carbide (SIC) is known. For example, in U.S. Pat. No. 4,830,873 the resultant thick (6–8 microns), abrasion resistant coating contains $SiO_{1.5-2.0}$, SiC and $Si_3N_4$; in U.S. Pat. No. 4,927,704 an anti-scratch layer of $SiO_2$ was deposited over a gradational layer, which in turn, was deposited over a plasma-polymerized vinyltrimethylsilane base layer; in U.S. Pat. No. 5,211,995 a layer of $SiO_2$ is deposited using a silane ($SiH_4$)/nitrous oxide ($N_2O$) system over a decorative, organic material layer; and in JP SHO 60-155675 a surface-hardened film layer containing SiC and silanol groups is deposited from gaseous mixtures of certain silicon-containing compounds. Co-pending application Ser. No. 08/230,025, titled "POLYMERIC ARTICLE WITH IMPROVED SURFACE PROPERTIES," inventors McPherson and Hozbor, filed Apr. 19, 1994, of common assignment herewith, describes a process for modifying the surface of a polymeric article with a low temperature plasma gas composition consisting essentially of a mixture from 80 to 40 mole percent $N_2O$ and with 20 to 60 mole percent $CO_2$, where such modified surface has improved adhesive strength to another similarly treated surface and improved receptivity for paint and other coatings.

SUMMARY OF THE INVENTION

The present invention provides a process for forming a coating on the surface of a substrate which has an anti-fog or anti-scratch properties or a combination of anti-fog and anti-scratch properties and which is long lasting, mechanically durable and washable. The process comprises the plasma-induced chemical vapor deposition of a thin film or coating layer on the exposed surface of the substrate using a silicon-containing organic compound as the gaseous source and then exposing the thus treated surface to a low temperature, plasma gas composition consisting essentially of a mixture of $N_2O$ and $CO_2$, for a time sufficient to modify the composition of said surface so that a durable, washable, long lasting coating results.

DETAILED DESCRIPTION OF THE INVENTION

Plasma is often referred to as the fourth state of matter. When energy is applied to a solid, the solid can undergo a transition to the liquid state. If further energy is applied, the liquid becomes a gas. If additional energy of the proper kind is applied, the gas dissociates and becomes plasma. Plasmas exist in a variety of forms. The preferred plasma is a low pressure or vacuum process so the temperature of the substrate is within tens of degrees of ambient, which is about 20° C., preventing thermal degradation of the plastic or thermal distortion of the molded plastic article when a material made of plastic is being treated. Inside the plasma chamber where the substrate to be treated is present, active species in the form of electrons, free-radicals, ions and energetic neutrals collide with the surface of the substrate, e.g. polymer or other material, breaking molecular bonds and creating new functional groups on the surface. These active and energetic species also react in the gas phase, resulting in a thin coating being deposited on the substrate as well as the walls of the reactor.

Suitable plasma systems for use in the present invention are the more technologically advanced, primary plasma systems which incorporate a parallel plate electrode design where parts to be treated are exposed directly to the primary field of RF energy, but are not part of the circuitry. The subsequent primary plasma is particularly more uniform and more efficient since the part is exposed in all three dimensions to the glow discharge. With higher pressure processes (but still within the general definition of a cold gas plasma), some form of gas delivery system, designed to create a uniform laminar flow of process gas throughout the entire chamber volume is beneficial. In multiple electrode/shelf designs, it is important that each of the electrodes receive equal amounts of RF energy. In this manner a uniform glow discharge is created in between each shelf or in each plasma zone. Solid state components and microprocessor control of the system parameters of process time, flow rate, power level, and working pressure, will also ensure process uniformity, efficiency, and repeatability.

Since plasmas are electrically conductive atmospheres, they carry a characteristic impedance to the output of the RF generator. Therefore, the preferred plasma process utilizes a matching network to constantly tune the plasma impedance to the output impedance of the RF generator. Advanced plasma systems suitable for use in the present invention are available from HIMONT Plasma Science, Foster City, Calif. (a business unit of HIMONT U.S.A., Inc.), and incorporate an automatic matching type of network and provisions for error checking during a process.

The low temperature plasma is generated in a gaseous atmosphere at reduced pressure of from about 0.001 to about 10 Torr, preferably from about 0.01 to about 5 Torr, more preferably from about 0.05 to about 1.0 Torr, most preferably from about 0.050 to about 0.400 Torr. The electric power can be supplied to the equipment at a high radio frequency, from about 40 KHz to 3 GHz, preferably from 13 to 27 MHz, and most conveniently at 13.56 MHz. To achieve the desired plasma condition in the gaseous atmosphere, the electric power delivered to the apparatus can vary over a range of from about 10 to 10,600 watts; preferably from about 50 to about 5,000 watts, more preferably from about 250 to about 3000 watts, most preferably from about 500 to about 2500 watts. The power used is somewhat dependent on chamber working volume. The most preferred 500 to 2500 watts is appropriate for HIMONT Plasma Science PS0500D gas plasma apparatus with a working volume of 5.0 cubic feet. The plasma treatment time varies from a few seconds to several tens of minutes, preferably from about 20 seconds to about 30 minutes, most preferably from 60 seconds to about 20 minutes.

It should be appreciated that treatment pressure, time and power are interrelated, rather than independent, variables. The effect of the level selected for each of these variables will determine the extent of substrate surface modification and/or coating thickness; also related are the chamber volume and geometry as well as the sample size and surface geometry. The selection of the level for these variables is within the ordinary skill of practitioners in the art to which this invention pertains.

The first coating layer is deposited onto the surface of a suitable substrate by low temperature plasma-induced vapor deposition of silicon-containing compounds having one to three Si atoms which compounds are selected from the group consisting of silazanes, silanes of the formula $SiR_4$ where R is the same or different and is H, a $C_{1-8}$ linear or branched alkyl or alkoxy; a $C_{6-10}$ aryl, unsubstituted or substituted with $C_{1-4}$ linear or branched alkyl; a vinyl radical, i.e. —CH=CH$_2$, or a $C_{3-5}$ allyl radical, provided that when R is H only one or two Rs are H, and organosilicones based on a structure consisting of alternate silicon and oxygen atoms with various organic radicals attached to the silicon having the formula

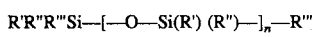

R'R"R'''Si—[—O—Si(R') (R")—]$_n$—R''' where R', R" and R''' can be the same or different and are $C_{1-8}$ linear or branched alkyl or alkoxy, R' and R" can also be hydrogen provided that no more than 50% of the R' and R" are hydrogen, and n is 1, 2 or 3.

Suitable silicon compounds include hexamethyldisiloxane (HMDSO), methyltrimethoxy silane (MTMS), vinyltrimethoxy silane (VTMS), vinyltriethoxy silane (VTES), ethylmethoxy silane (EMS), ethyltrimethoxy silane (ETMS), tetraethoxy silane (TES), cyclohexylmethyl-dimethoxy silane (CMDMS), dicyclopentyl-dimethoxy silane (DCDMS), phenyltriethoxy silane (PES), diphenyldimethoxy silane (DPDMS), tetramethyldisiloxane (TMDSO), hexamethyltrisiloxane (HMTSO) and hexamethyldisilazane (HMDSN).

The silicon compounds employed are introduced into the plasma deposition chamber in the gaseous state. Prior to being introduced into the chamber the silicon compound is heated to a temperature of 40° to 100° C., generally 40° to 60° C., to vaporize the compound and create sufficient vapor pressure such that the coating is deposited at a reasonable speed. Oxygen in gaseous form and argon are fed into the deposition chamber simultaneously with, but each with a separate feeding means and mass flow controller, the gaseous silicon compound. Depending upon the application, the O$_2$ flow rate ranged from 200 sccm to 1200 sccm, the gaseous silicon compound flow is from 20 sccm to 250 sccm, and Ar flow is from 10 sccm to 150 sccm.

Argon is used to enhance the rate of deposition of the gaseous materials being employed and, therefore, it is preferable to use same in the process.

Oxygen is essential to this plasma deposition process with the silicon compounds according to this invention. Without oxygen it is not possible to obtain a plasma-induced anti-fog or anti-scratch coating using the aforementioned silicon compounds. The ESCA results indicate that the oxygen has an oxidizing effect on the silicon compounds employed. Whatever oxidizing effect it has, it appears to be necessary if one is to obtain the anti-fog and/or anti-scratch coatings of this invention.

The total vapor pressure of the gaseous materials introduced into the plasma deposition chamber for the deposition of the first coating layer of an anti-fog coating is about 0.040 to about 0.500 Torr, preferably 0.350 to 0.450 Torr, most preferably 0.400 Torr. The process pressure must be such that a low bias potential on the RF-driven electrode is achieved. If the bias potential exceeds several tens of volts during the plasma deposition a coating which fogs results.

The total vapor pressure for the first coating layer of an anti-scratch coating is from 0.040 to 0.400 Torr, preferably from 0.060 to 0.130 Torr, depending on the process used and the substrate being treated.

The substrate may be flat (two dimensional) or complex (three dimensional). Complex shapes are those three dimensional substrates, articles or structures wherein the dimension along then "z" axis is greater than or equal to 10% dimension along the "z" axis is greater than or equal to 10% of the dimension along either the "x" or "y" axis in the surface of the plane, such as, for example, motor vehicle bumpers and fenders.

The aforementioned advanced plasma systems available from HIMONT Plasma Science, such as the PS0500D reactor are equipped with a throttle valve, thereby making it possible to achieve a range of process pressures with the same gas flow rate.

The plasma treatment time for anti-fog coatings is from 10 1 minute to 10 minutes, preferably 1.5 to 4 minutes, most preferably, 1.5 to 2.5 minutes; and the RF power used to cause reaction of the vapor is from 200 to 1500 watts, preferably 1000 to 1400 watts, most preferably 1100 to 1300 watts.

The plasma treatment time for depositing anti-scratch coatings is from 5 to 25 minutes, preferably from 10 to 20 minutes, most preferably from 10 to 15 minutes. The RF power employed ranges from 1200 to 2500 watts and depends on the substrate being treated and the throughput requirements.

The resulting anti-fog coatings can be produced in different thicknesses, but typically from 0.1 to 2.5 microns, preferably 1 to 2 microns. Likewise the anti-scratch coatings can have variable thicknesses, typically from 3.0 to 10 microns, preferably 5 to 7 microns.

Both anti-fog and anti-scratch coatings can be applied to a substrate in either order. Preferably the RF power and gas flow for the deposition step involving the silicon compound for the anti-scratch coating is doubled when the anti-fog coating is deposited first to reduce the deposition time to approximately 10 minutes. Most preferably the anti-fog coating is applied last.

The anti-fog coating has a surface energy of about 73 dynes/cm or more. Since water has a surface energy of 73 dynes/cm, any water which condenses on the thus coated substrate or article has a tendency to spread over the entire surface. The net result is less light scattering than one would obtain with condensed water droplets on a surface having a lower surface energy.

The thus treated surface of the resulting substrate or, put another way, the surface of the first or top coating, may then be treated to a surface modifying step by being exposed to a low temperature plasma gas composition consisting essentially of a mixture of from 80 to 40 mol % $N_2O$ with 20 to 60 mol % $CO_2$, preferably 70 to 45 mol % $N_2O$/30 to 55 mol % $CO_2$, most preferably from 60 to 45 mol % $N_2O$/40 to 55 mol % $CO_2$, where the amount of $N_2O$ and $CO_2$ in the mixture equals 100 to 10 mol %, for a time sufficient to modify the surface of the coating to enhance its durability.

The plasma process is generally practiced as follows. The parts to be treated are placed into a vacuum chamber and the chamber pressure is reduced, typically to 0.005 Torr. The process gas or gas mixture, as the case may be, employed is introduced to the chamber and the chamber pressure stabilized at a pressure of 0.040–0.400 Torr. The interior dimensions of the work area is approximately 1.73×0.76×1.02 meters (width x height x depth) for a total working volume of 1.34 cubic meters. A suitable high frequency form of energy, typically 13.56 MHz radio frequency energy, is used to create the plasma; in the system described this is achieved with a total power input capacity of up to 2500 watts. The RF energy dissociates the gas, creating a plasma characterized by a distinctive glow. Since the process is conducted at reduced pressures, the bulk temperature of the gas is near ambient temperature, thus the reference to a cold gas plasma, a glow discharge, or a cold gas glow discharge. The electrons or ions created in the plasma bombard the substrate's surface, abstracting atoms or breaking bonds, creating free radicals. These free radicals are unstable and seek to satisfy a more stable state by reacting with free radicals or groups within the plasma gas, also establishing new moieties on the surface of the substrate. In addition, the energetic electrons in the glow discharge fragment the molecules in the gas phase, leading to complex chemical reactions that result in a thin film coating being deposited.

Usually, before plasma deposition, an initial step is performed. The purpose of this step is substrate cleaning and/or adhesion promotion of the subsequently deposited thin film coating. The gases are usually either Ar alone, $O_2$ alone, or 50/50 mixtures of Ar and $O_2$. Gas flow rates are in the range of 20–100 sccm (standard cc/min), preferably 40–80 sccm, and most preferably 50–60 sccm. RF power is approximately 1100 watts, and process pressure is about 0.040 Torr. One minute process time is all that is required.

After the initial step, the next step is the plasma deposition of the anti-scratch and/or anti-fog coating(s) as described in the examples below.

Often, but not always, a step subsequent to the $CO_2$ and $N_2O$ surface treating step is used to enhance the durability or uniformity of the plasma coating. Useful process gases are Ar and/or $O_2$. Process times are usually 1 to 3 minutes, with 2 minutes being optimum most often. Gas flows range from 40–250 sccm, with process pressures between 0.200–0.400 Torr, and RF input power between 150–1500 watts.

The substrates or articles useful in the present invention include glass, mirror, silicon chip and polymer materials. Suitable polymer materials include polycarbonate, such as CR-39 polycarbonate; isotactic and syndiotactic propylene polymer materials; ethylene polymers; polyamides; polyesters, such as polyacrylates, polymethacrylates and poly(ethylene) terephthalates; polystyrene; styrene copolymers containing 70% polymerized styrene units; epoxy; polyphenylene ether (PPE); and polyvinyl halide polymers generally and PVC in particular. Propylene polymer materials and ethylene polymers include homopolymers, copolymers and terpolymers with other alpha-olefin monomers and/or aliphatic diene monomers, and mixtures of such polymers.

Suitable propylene polymer materials include (I) homopolymers of propylene; and (II) random crystalline propylene copolymers, terpolymers or both, containing from about 80 to about 98.5% of propylene; preferably about 90 to about 95%, more preferably about 92 to about 94% of propylene; and from about 1.5 to about 20.0% of at least one comonomer selected from the group consisting of ethylene and $C_4$–$C_m$ alpha-olefins.

Additionally useful propylene polymer materials are (III) heterophasic or impact-modified polyolefin compositions obtained by sequential copolymerization or mechanical blending of (I) or (II) with an elastomeric olefin copolymer or terpolymer fraction such as elastomeric ethylene-propylene, ethylene-butene-1, propylene-butene-1 copolymers, and ethylene-propylene-diene monomer terpolymers. Suitable heterophasic polyolefin compositions of this type include, for example, those described in European patent application EP A-416 379, and in European patent EP B-77 532.

The polymer materials may be in the form of molded articles, films, sheets, laminates, or woven or nonwoven textiles.

The coatings are hard, durable and transparent and are useful in production of biomedical instruments, ophthalmic lenses, microchips, windows, sky lights, instrument panels and mirrors with anti-fog and/or anti-scratch coatings.

The following examples are illustrative of this invention and are not meant as a limitation of the invention disclosed and claimed herein.

The mass flow controller used to deliver silicon-containing compound for the deposition processes was calibrated for the flow rate of HMDSO. The flow rates of other gases were calculated based on the specific heats of the respective gases. The accuracy of the mass flow controllers in these cases is ±5% or better.

EXAMPLE 1

This example illustrates the process of this invention in applying an anti-fog coating to a polymeric substrate. 60 mil polycarbonate sheets (Cyrolon ZX polycarbonate sheets commercially available from Cyro Industries) were treated in a Plasma Science PS0500D gas plasma reactor as follows in Table 1.

TABLE 1

| Step # | Gas Input | Flow Rate (sccm)* | RF Power (Watts) | Pressure (Torr) | Time (Minutes) |
|---|---|---|---|---|---|
| 1 | Ar | 58 | 1080 | 0.040 | 1.0 |
| 2 | $O_2$ | 1560 | 1200 | 0.400 | 2.0 |
|   | HMDSO | 52 |  |  |  |
|   | Ar | 43 |  |  |  |
| 3 | $N_2O$ | 200 | 1325 | 0.250 | 2.0 |
|   | $CO_2$ | 207 |  |  |  |

*sccm = standard cm³/minute

EXAMPLE 2

This example illustrates the process of this invention in applying an anti-fog coating to a three-dimensional complex substrate.

A conductive backing made of copper flashing tape (McMaster-Carr Supply Co., Los Angeles, Calif.) was placed behind the surface of flat polycarbonate samples (cut from a Cyrolon ZX sheet) measuring ~1.5"×9"×0.060" such that the substrate maintained intimate contact with the backing. The backing was electrically connected to the RF power lead on the biased electrode of the PS0500D reactor. The conductive backing created a bias behind the substrate which promoted good, uniform deposition. Samples with (1) no backing (control), (2) a thin (approximately 2 mil) foil copper backing, and (3) a thin foil copper backing which was attached to the leads of the powered electrode. One sample at a time was placed on the electrode such that the surface to be treated faced forward against the flow of the silicon compound and the long length of the sample tilted at ~30° angle upwards so that the distance from the treated surface to the biased electrode varied from 0" to ~5". An anti-fog coating was then deposited on the unprotected side of the polycarbonate sample according to the procedure and materials of example 1.

The results show that for the non-backed substrate (1) wettability occurred only within ~½ inch distance from the biased electrode. The backed substrate without electrical contact with the RF feed (2) provided a very uniform coating, but with no wettability at the 70 dyne/cm level. The substrate with a backing which was connected to the electrode leads (3) produced a uniform coating with very wettable properties comparable to that of flat substrates placed directly on the biased electrode.

EXAMPLE 3

This example illustrates the process of this invention in depositing an anti-scratch coating on a polymeric substrate.

A 60 mil polycarbonate sheet as described in example 1 was coated in a Plasma Science PS0500D reactor as set forth in Table 2.

TABLE 2

| Step # | Gas Input | Flow Rate (sccm)* | RF Power (Watts) | Pressure (Torr) | Time (Minutes) |
|---|---|---|---|---|---|
| 1 | Ar | 58 | 1080 | 0.040 | 1.0 |
| 2 | $O_2$ | 525 | 1200 | 0.060 | 25.0 |
|   | HMDSO | 94 | | | |
|   | Ar | 62 | | | |
| 3 | $N_2O$ | 200 | 1325 | 0.250 | 2.0 |
|   | $CO_2$ | 207 | | | |

*sccm = standard cm³/minute

After the coating was completed, the resulting coated sheet sample was tested in a Plasma Science scratch tester comprising a 200 gm load applied to a 800-grit Bosch fine sanding cloth equipped with a red LED light emitter to emit light onto the sample, a photodetecter light sensor to detect the light reflected from the sample, a counter to count the number of passes and a recorder to record the number of passes. The number of passes required to reach a level of haze sufficient to reduce the reflected light of the red LED beyond the detection level of the light sensor is recorded. This gives a comparative determination of the scratch resistance of a given substrate. Table 3 summarizes the scratch tester results of processes according to this invention.

TABLE 3

| Sample | # Tester Strokes |
|---|---|
| Process A Table 2 process with 25-minute deposition | 1173 |
| Process B Double Power/Double Flow Rate, 10-minute deposition | 2127 |
| Commercial GE* | 1570 |

TABLE 3-continued

| Sample | # Tester Strokes |
|---|---|
| Commercial MXL** | 115 |
| Commercial Exxene*** | 25 |
| Control (uncoated) | 5 |

*General Electric UVHC-8550-01 hardcoat
**MXL = MXL Industries, Inc., Lancaster, PA 17601
***Exxene Corporation, Corpus Christi, TX

EXAMPLE 4

This example illustrates the process of this invention in applying an anti-scratch coating to a complex shape having a certain radius of curvature.

A scratch-resistant coating was deposited on highly curved polycarbonate substrate samples, both without any backing and backed with a thin (approximately 35 mil), aluminum sheet stock shaped to conform to the curved polycarbonate face shield. Samples were ~5"×9" and had a radius of curvature of ~3.5". The resulting substrate sample without any backing displayed almost no scratch-resistant properties when tested by hand stroking the coated surface with 0000 steel wool and yielded a definite pattern of colored striations. The substrate sample backed with a curved, fitted aluminum sheet showed marked improvement in scratch-resistance with absolutely no color interference fringes. Testing by repeated stroking the coating surface with 0000 grade steel wool showed almost no scratching of the surface and no noticeable differences between those backings that were connected to the electrode and those that were free. Scratch tests conducted with the Plasma Science scratch tester described in example 3 produced comparable readings for both types of backing situations, only in this case a 10 mil aluminum backing was used (see Table 4).

TABLE 4

| Brief Description | # Tester Strokes |
|---|---|
| 0.010" Al backing connected to RF feedthrough | 68 |
| 0.010" Al backing not connected | 50 |

EXAMPLE 5

This example illustrates the durability of the anti-scratch coatings prepared using the process of this invention.

The durability of the anti-scratch coatings prepared according to example 3 were tested by using a common specification for anti-scratch coatings applied to transparent plastics, namely the ability of the coating to withstand immersion in hot water. One polycarbonate sheet (Cyrolon ZX) sample was prepared using only the pre-glow (step 1, Table 2) and plasma-enhanced chemical vapor deposition of the silicon compound (step 2, Table 2). As shown in Table 5, this sample softened as a result of hot water (60° C.) immersion for 72 hours. A second polycarbonate sheet (Cyrolon ZX) sample was coated in the same manner as the first sample except that it was also treated with the $N_2O/CO_2$ surface modifying step (step 3, Table 2) and immersed in hot water at the same temperature and for the same time as the first sample. This second sample with the coating having the surface modifying step showed no change in scratch resistance after hot water immersion. The results are set forth in Table 5 below.

TABLE 5

| Coating/substrate | Performance (as deposited) | Performance (after 72 hr. 60° C. water immersion) |
|---|---|---|
| Anti-scratch Coating (Table 2, #1, #2)/polycarbonate | Very Good[1] | Poor[2] |
| Anti-scratch Coating (Table 2, Steps 1–3) with $N_2O/CO_2$ post treatment/polycarbonate | Very Good | Very Good (Unchanged) |

[1] = resistant to scratching by hand with 0000 steel wool
[2] = scratches when tested with 0000 steel wool

EXAMPLE 6

This example illustrates the durability of the anti-fog coatings prepared using the process of this invention.

The durability of the anti-fog coating prepared according to example 1 were tested using a "breath" test whereby the sample is held ~1 inch from mouth to determine if the exhaled moisture fogs sample.

One Cyrolon ZX polycarbonate sheet sample was produced without a $N_2O/CO_2$ post-glow (using only steps 1 and 2, Table 1), and the second Cyrolon ZX polycarbonate sheet sample was coated using all 3 steps of Table 1. As shown by the data in Table 6 below, the $N_2O/CO_2$ surface modifying step more than doubled the time to the first occasion of fogging from a "breath" test.

TABLE 6

| Coating/substrate | Performance (days to first signs of fogging) no wash | Performance (days to first signs of fogging) IPA wash |
|---|---|---|
| Polycarbonate | 0 | — |
| PP* anti-fog/polycarbonate | 7 | 21 |
| PP anti-fog + $N_2O/CO_2$ post treatment/polycarbonate | 16 | 35 |

*PP = plasma polymerized synonymous to plasma deposited

In most applications requiring an anti-fog coating, washing of the optical element(s) with a 70% isopropyl alcohol (IPA) solution in $H_2O$ is common. As shown in Table 6 above, washing the anti-fog coating produced by this invention actually enhances the anti-fog characteristics. Most conventional anti-fog coatings currently available are actually destroyed by IPA washing.

EXAMPLE 7

This example illustrates the use of a silazane compound in applying an anti-fog coating to a polymeric substrate.

As another example, an anti-fog coating was deposited on a polycarbonate sheet sample using a silazane compound, namely hexamethyldisilazane (HMDSN). An initial step and a plasma deposition step were performed in a Plasma Science PSO500D reactor according to the conditions specified in Table 7 below.

TABLE 7

| Step # | Gas Input | Flow Rate (sccm)* | RF Power (Watts) | Pressure (Torr) | Time (Minutes) |
|---|---|---|---|---|---|
| 1 | Ar | 58 | 1040 | 0.039 | 1.0 |
| 2 | $O_2$ HMDSN Ar | 200 37[1] 14 | 220 | 0.040 | 2.0 |

*sccm = standard $cm^3$/minute
[1]Calculated assuming the same calibration factor as for HMDSO When the resulting anti-fog coating was washed with commercially-available Comet® bleach solution (approximately by volume in $H_2O$) a total of 55 times, it was still better than a control (uncoated) polycarbonate sheet sample when tested by the "breath" test. An anti-fog coating produced by the method of example 1 produced comparable results when bleach washed in the same manner and "breath" tested.

EXAMPLE 8

The example illustrates the use of a silane derivative in applying an anti-fog coating to a polymeric substrate.

Tetraethoxysilane (TES) was used as the silicon-containing compound to deposit an anti-fog coating on polycarbonate sheet sample using the process conditions and materials of example 8.

TABLE 8

| Step # | Gas Input | Flow Rate (sccm)* | RF Power (Watts) | Pressure (Torr) | Time (Minutes) |
|---|---|---|---|---|---|
| 1 | Ar | 16 | 1040 | 0.039 | 1.0 |
| 2 | $O_2$ TES Ar | 1000 35[1] 16 | 1200 | 0.403 | 2.0 |
| 3 | $N_2O$ $CO_2$ | 200 207 | 300 | 0.254 | 2.0 |

*sccm = standard $cm^3$/minute
[1]Calculated assuming the same calibration factor as for HMDSO As in the previous example, this coating was washed with approximately 5% (volume) Comet® bleach solution in $H_2O$. When tested by the "breath" test, this coating showed no sign of fogging for 10 days (10 washes with bleach).

An anti-fog coating produced with HMDSO according to the process of example 1 showed no evidence at all of fogging by the "breath" test for 9 days.

EXAMPLE 9

This example illustrates the use of the anti-fog coating process followed by the anti-scratch coating process as a continuous process to provide a clear, non-fogging hardcoat (i.e. anti-scratch) for transparent substrates, e.g., polycarbonates and acrylics.

A coating was deposited on Cyrolon ZX polycarbonate sheet sample using the procedure and materials of example 1 followed by the procedure and materials of example 3, steps 2 and 3, but with twice the RF power and double the gas flow rates (10-minute coating time) with respect to step 2 of example 3. Spectrum #5 in Table 12 (survey scan) and Spectrum #5 in Table 13 (high-resolution scan) provide ESCA data on the resulting coating.

Although the above example show the deposition of the anti-fog coating first, the anti-scratch coating can be deposited first and then the anti-fog coating, using, for example, the procedure and materials of example 3 followed by the procedure and materials of example 1.

EXAMPLE 10

The example illustrates the deposition of an anti-scratch coating on an acrylic sheet.

Cyro Industries' Acrylite FF acrylic sheet sample (60-mil thickness) was coated in a Plasma Science PS0500D reactor as set forth in Table 10.

TABLE 10

| Step # | Gas Input | Flow Rate (sccm)* | RF Power (Watts) | Pressure (Torr) | Time (Minutes) |
|---|---|---|---|---|---|
| 1 | $O_2$ | 56 | 1040 | 0.040 | 1.0 |
|   | Ar | 56 |  |  |  |
| 2 | HMDSO | 94 | 1810 | 0.400 | 2.0 |
| 3 | $O_2$ | 525 | 1200 | 0.400 | 2.5 |
|   | HMDSO | 94 |  | 0.350 | 2.5 |
|   | Ar | 62 |  | 0.300 | 2.5 |
|   |  |  |  | 0.250 | 2.5 |
|   |  |  |  | 0.200 | 2.5 |
|   |  |  |  | 0.150 | 2.5 |

*sccm = standard $cm^3$/minute

When tested with the scratch tester, using the same conditions cited above for Table 3, the results shown in Table 11 were obtained.

TABLE 11

| Sample | Tester Strokes |
|---|---|
| Table 10 Process 15 min. anti-scratch/Acrylite FF | 1665 |
| Table 10 Process 25 min. anti-scratch/Acrylite FF | >4100 |
| Control (uncoated) Acrylite FF | 2 |

The stoichiometry of the anti-fog coating produced according to example 1 is shown in Table 12 (Spectrum #1), while Table 13 gives the high-resolution ESCA data for this anti-fog coating (first sample described therein).

Table 12 gives the stoichiometry of the anti-scratch coating deposited according to example 3 (Spectrum #3) as revealed by ESCA analysis. Table 13 presents high-resolution ESCA data for this anti-scratch coating (third sample described therein).

TABLE 12

ESCA Results: Elemental composition data measured from the surface (approximately the top 100Å) of each sample and expressed in atomic percent units for the elements detected

| Spectrum # | Sample Description | Si | C | N | O | F | Na |
|---|---|---|---|---|---|---|---|
| 1 | ANTI-FOG (AF) COATING with surface modifying treatment | 29. | 10. | 0.3 | 60. | — | — |
| 2 | 2 min AF COATING, no surface modifying treatment | 29. | 11. | — | 60. | — | — |
| 3 | ANTI-SCRATCH (AS) COATING ON 0.060" PC with surface modifying treatment | 25. | 21. | 0.4 | 53. | 1.0 | — |
| 4 | 10 min AS COATING, 2x FLOW, 2x RF, no surface modifying treatment | 29. | 21. | — | 50. | — | — |
| 5 | Ar/AF (2 min)/$N_2O$, $CO_2$/AS (10 min)/$N_2O$, $CO_2$ | 28. | 14. | 0.3 | 58. | — | — |

Note: The symbol (—) indicates no signal was detected for that element.
Note: The F content in Spectnun #3 is adventitious.

TABLE 13

High resolution ESCA data: Binding energies, atom percentages and peak assignments.
(Binding energies were corrected to the binding energy of the —$(CH_2)_n$- signal at 284.6 eV. Atom percentages were calculated from the high resolution data. Peak assignments were based on the binding energies of reference compounds).

| Sample Desription | $Si_1$ | $C_1$ | $C_2$ | $C_3$ | $N_1$ | $N_2$ | $O_1$ | $F_1$ | $F_2$ |
|---|---|---|---|---|---|---|---|---|---|
| ANTI-FOG (AF) COATING with surface modifying treatment |  |  |  |  |  |  |  |  |  |
| Binding Energy (eV) | 103.1 | 284.6 | 286.3 | 288.8 | 399.3 | 401.1 | 532.5 | — | — |
| Atom Percent | 29. | 7.8 | 1.9 | 0.6 | 0.2 | 0.1 | 60. | — | — |
| 2 min AF COATING, no surface modifying treatment |  |  |  |  |  |  |  |  |  |
| Binding energy (eV) | 103.4 | 284.6 | 286.4 | 289.0 | — | — | 533.0 | — | — |
| Atom Percent | 29. | 8.7 | 1.9 | 0.4 | — | — | 60. | — | — |
| ANTI-SCRATCH (AS) COATING ON 0.060" PC with surface modifying treatment |  |  |  |  |  |  |  |  |  |
| Binding energy | 103.2 | 284.6 | 286.4 | 288.6 | 399.9 | 401.7 | 532.7 | 684.5 | 689.8 |
| Atom Percent | 25. | 16. | 3.8 | 1.0 | 0.3 | 0.1 | 53. | 0.2 | 0.8 |
| 10 min AS COATING, 2x FLOW, 2x RF, no surface modifying treatment |  |  |  |  |  |  |  |  |  |
| Binding energy (eV) | 103.2 | 284.6 | 286.0 | 288.5 | — | — | 532.9 | — | — |

TABLE 13-continued

High resolution ESCA data: Binding energies, atom percentages and peak assignments.
(Binding energies were corrected to the binding energy of the —$(CH_2)_n$- signal at 284.6 eV. Atom percentages were calculated from the high resolution data. Peak assignments were based on the binding energies of reference compounds).

| Sample Desription | $Si_1$ | $C_1$ | $C_2$ | $C_3$ | $N_1$ | $N_2$ | $O_1$ | $F_1$ | $F_2$ |
|---|---|---|---|---|---|---|---|---|---|
| Atom Percent Ar/AF (2 min)/$N_2O$, $CO_2$/AS (10 min)/$N_2O$, $CO_2$ | 29. | 17. | 3.0 | 0.7 | — | — | 50. | — | — |
| Binding energy (eV) | 103.1 | 284.6 | 286.4 | 288.7 | 399.1 | 400.7 | 532.6 | — | — |
| Atom Percent | 28. | 9.7 | 3.4 | 0.7 | 0.1 | 0.1 | 58. | — | — |

Peak Assignments:
$Si_1 = SiO_2$
$N_1 = \overline{N}R_3$
$N_2 = \overline{N}R_4^+$
$C_1 = \overline{C}$—R (R = C, H)
$C_2 = \overline{C}$—OR, $\underline{C}$—N
$C_3 = \overline{O} = C$—$\overline{O}R$
$O_1 = Si$—$\underline{\overline{O}}$, C—$\underline{O}$
$F_1 = F^-$
$F_2 = \overline{C}F_x$
Note:?
The F detected in the anti-scratch coating on 0.060" PC with post-glow treatment is adventitious.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for preparing an anti-fog coating, an anti-scratch coating or a combined anti-fog, anti-scratch coating on a surface of a substrate in one or more plasma reaction zones of an evacuated chamber, comprising:

(a) optionally bombarding the surface with plasma species sufficient to clean the surface or to promote adhesion of a coating to be placed thereon;

(b) coating the surface with polymerized silicon by plasma polymerization, the polymerized silicon coating derived from a coating gas stream including a silicon monomer and oxygen, the plasma polymerization being conducted with a power density over a length of time; and, (c) modifying the coated surface with a plasma composition derived from a surface modifying gas stream, the surface modifying gas stream consisting essentially of from about 80 to 40 mole % $N_2O$ and from about 20 to 60 mole % $CO_2$.

2. The method as in claim 1 wherein the polymerized silicon coating includes Si, C, N and O atoms therein.

3. The method as in claim 1 or 2 wherein the coating is an anti-scratch coating and has greater than 10 atomic % carbon atoms contained within the top about 100 Å thereof.

4. The method as in claim 1 or 2 wherein the surface is curved.

5. The method as in claim 1 or 2 wherein the substrate is a polymeric material.

6. The method as in claim 5 wherein the substrate and coating are adapted for optical applications.

7. The method as in claim 1 wherein the coating step includes conducting the plasma polymerization with a plurality of power densities.

8. The method as in claim 1 wherein the pressure while conducting the coating step in the chamber for an anti-fog coating is between about 40 to about 500 mTorr and for an anti-scratch coating is between about 40 to 400 mTorr.

9. The method as in claim 1 wherein the surface modifying step enhances durability of the coating.

10. The method as in claim 1 wherein the surface modifying step is conducted for about 1 to 3 minutes.

11. The method as in claim 1 wherein the silicon monomer of the coating step is a silazane, a silane or an organosilicone having one to three silicon atoms.

12. The method as in claim 1 wherein the coating gas stream further includes argon.

13. The method as in claim 1 wherein the coating has a thickness between about 0.1 micron to about 10 microns with about the top 100 Å of the coating having from about 53 to 60 atomic % O, about 25 to 29 atomic % Si, about 10 to 21 atomic % C, and a trace of atomic % N.

* * * * *